(12) United States Patent
Cvetkovic

(10) Patent No.: US 7,127,016 B1
(45) Date of Patent: Oct. 24, 2006

(54) NONUNIFORM OVERSAMPLED FILTER BANKS FOR AUDIO SIGNAL PROCESSING

(75) Inventor: Zoran Cvetkovic, Summit, NJ (US)

(73) Assignee: AT&T Corp, New York, NY (US)

( * ) Notice: Subject to any disclaimer, the term of this patent is extended or adjusted under 35 U.S.C. 154(b) by 0 days.

(21) Appl. No.: 11/233,322

(22) Filed: Sep. 22, 2005

Related U.S. Application Data

(63) Continuation of application No. 09/923,098, filed on Aug. 6, 2001, now Pat. No. 6,996,198.

(60) Provisional application No. 60/243,811, filed on Oct. 27, 2000.

(51) Int. Cl.
H04B 1/10 (2006.01)

(52) U.S. Cl. ............. 375/350; 708/300; 708/819; 370/484

(58) Field of Classification Search ........... 370/384, 370/484; 704/220; 708/300, 819; 375/350; 455/213, 307, 343
See application file for complete search history.

(56) References Cited

U.S. PATENT DOCUMENTS

| | | | |
|---|---|---|---|
| 4,107,470 A | 8/1978 | Maruta | 380/28 |
| 5,299,192 A | 3/1994 | Guo et al. | 370/210 |
| 5,436,940 A | 7/1995 | Nguyen | 375/240 |
| 5,568,142 A * | 10/1996 | Velazquez et al. | 341/126 |
| 5,732,189 A | 3/1998 | Johnston et al. | 704/230 |

OTHER PUBLICATIONS

"Oversampled Filter banks", Cvetkovic et al., IEEE Trans on signal processing, vol. 46, No. 5, May 1998.*
A new class of uniform filter banks based on recursive Nth-band filters, Renfors, M.; Neuvo, Y.; Mitra, S.; Acoustics, Speech, and Signal Processing, IEEE International Conference on ICASSP '86. vol. 11, Apr. 1986 pp. 2555-2558.*
A generalized polyphase principle for uniform digital filter banks, Twicken, J.D.; Acoustics, Speech, and Signal Processing, 1988. ICASSP-88., 1988 International Conference on Apr. 11-14, 1988 pp. 1790-1793 vol. 3, Digital Object Identifier 10.1109/ICASSP. 1988. 196968.*
Zoran Cvetkovitc, ON Discrete Shotr-Time Fourier Analysis, pp. 2628-2640, vol. 48, No. 9, Sep. 2000, IEEE Transactions on Signal Processing.
J. Princen in "The Design of Nonuniform Filter Banks," IEEE Transactions on Signal Processing, vol. 43, No. 11, pp. 2550-256 Nov. 1995.

* cited by examiner

*Primary Examiner*—Kevin Burd
*Assistant Examiner*—Ted M Wang
(74) *Attorney, Agent, or Firm*—Henry Brendzel

(57) ABSTRACT

A non-uniform filter bank is created by joining sections of oversampled uniform filter bands that are based on complex exponential modulation (as opposed to cosine modulation). Each filter bank handles a given, non-overlapping frequency band. The bands are not of uniform bandwidth, and the filters of different banks have different bandwidths. The frequency bands of the different filter banks cover the frequency of interest with gaps in the neighborhoods of the filter band edges. A set of transition filters fills those gaps.

29 Claims, 2 Drawing Sheets

NONUNIFORM OVERSAMPLED FILTER BANKS FOR AUDIO SIGNAL PROCESSING

RELATED APPLICATIONS

This application is a continuation of application Ser. No. 09/923,098, filed Aug. 6, 2001.

This application claims priority under application No. 60/243,811 filed on Oct. 27, 2000.

BACKGROUND OF THE INVENTION

This invention relates to filters and, more particularly, to filter banks for audio applications.

In many areas of audio processing, it is desirable to analyze an audio signal in approximately the same time-frequency form as the human ear (i.e., with bandwidths on the order of one Bark) and with a time resolution that is commensurate with the bandwidth of the filter. In addition, it is desirable to process the signals in each of the bands and then reconstruct them in a manner such that when the bands are unmodified, the filter bank has a nearly perfect reconstruction characteristic. Because the signals might be modified, and different bands might be routed to different devices, not only must the filters provide approximately exact reconstruction, they must also prevent aliasing due to the unequal processing, or modification, of adjacent frequency bands. Hence, an oversampled filter bank is required where aliasing introduced due to unequal processing of bands is below the level of human hearing.

One application for this kind of filter bank is found for the problem of separating parts of an individual audio signal into its directs and indirect parts for the purpose of rerouting, in real time, the direct and indirect signals to drivers that reproduce them appropriately. In such an application, a filter bank that approximates the critical bandwidths is essential to identifying the part of a signal with direct cues, and the ability of the reconstruction filter bank to prevent substantial aliasing when adjacent bands are added incoherently (as opposed to coherently) is also an absolute requirement. Hence the need for an oversampled critical band filter bank. In applications that require nonuniform division of signal spectrum, iterative cascaded of uniform filter banks are often used. Iterated filter banks, however, impose considerable structure on the equivalent filters, which results in inferior time-frequency localization compared to direct designs. A study of critically sampled nonuniform filter banks has been reported by J. Princen in "The Design of Nonuniform Filter Banks," *IEEE Transactions on Signal Processing*, Vol. 43, No. 11, pp. 2550–2560, November 1995. Nonuniform filter banks studied by Princen are obtained by joining pseudo QMF filter bank sections that are nearly perfect reconstruction filter banks based on cosine modulation and the principle of adjacent channel aliasing cancellation. R. Bernardini et al published "Arbitrary Tilings of the Time-Frequency Plane using Local Bases," *IEEE Transactions on Signal Processing*, Vol. 47, No. 8, pp. 2293–2304, August 1999, wherein they describe a cosine-modulation-based structure that allows for time-adaptive nonuniform tiling of the time-frequency plane. Despite their many fine features that are relevant to coding purposes, however, these approaches do not have good aliasing attenuation properties in each of the subbands independently. This makes them unsuitable for tasks where processing effects need to be contained within the bands directly affected. Perfect, or nearly perfect, reconstruction properties of these filter banks in the presence of upsampling are also not clear. The pseudo QMF bank, for instance, loses its aliasing cancellation property if the subband components are not critically downsampled.

Oversampled uniform filter banks based on cosine modulation were studied by Bolceskei et al, and reported in "Oversampled Cosine Modulated Filter Banks with Perfect Reconstruction, *IEEE Transaction on Circuits and Systems II*, Vol. 45, No. 8, pp. 1057–1071, August 1998, but the cosine modulation places stringent aliasing attenuation requirements.

SUMMARY OF THE INVENTION

An advance in the art is attained with non-uniform filter banks created by joining sections of oversampled uniform filter banks that are based on complex exponential modulation (as opposed to cosine modulation). Each filter bank handles a given, non-overlapping frequency band, and the filters of different banks have different bandwidths. The frequency bands of the different filter banks cover the frequency of interest with gaps in the neighborhoods of the filter band edges. A set of transition filters fills those gaps.

DETAILED DESCRIPTION

In accordance with the principles disclosed herein, non-uniform, oversampled filter banks are obtained by joining section of different uniform filter banks with the aid of transition filters. The uniform filter banks that are used are nearly perfect-reconstruction, oversampled, modulated filter banks.

Figure 1:
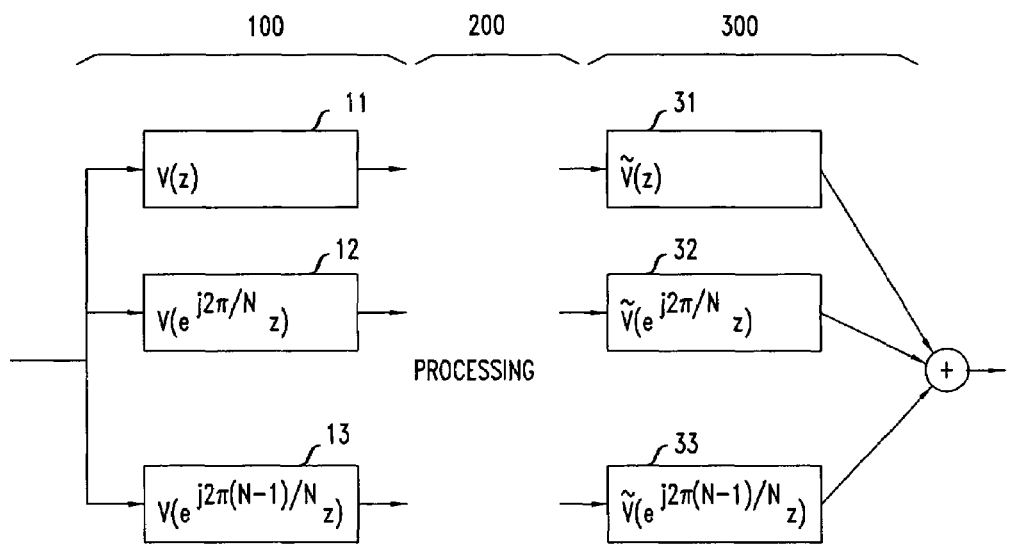
FIG. 1 shows an analysis filter bank stage, followed by a signal processing stage and a synthesis filter bank stage.

FIG. 1 shows an analysis filter bank 100, followed by a processing stage 200, and a synthesis filter bank 300. Analysis filter bank 100 is shown with N filter elements (of which elements 11, 12, 13 are explicitly shown), where each is a modulated version of a given window function, $v[n]$. That is, the time response of the $i^{th}$ filter in the bank is:

$$h_i[n] = v[n]e^{j\frac{2\pi}{N}(i-1)n} \quad i = 1, 2, \ldots, N. \tag{1}$$

The term $$e^{j\frac{2\pi}{N}(i-1)n}$$

creates filters that are offset in frequency from one another, through a complex modulation of the fundamental filter function $v[n]$, and some artisans call these filters "modulates" of the filter $v[n]$.

It can be shown that, when there is no subsampling in the channels of such a filter bank (and, indeed, analysis filter 100 shows no subsampling), a necessary and sufficient condition for perfect and numerically stable reconstruction of any signal, x, from its subband components $y_i$, where $$y_i = \sum_k x[k] h_i[n-k], \quad (2)$$

is given by $$0 < A \le \sum_{i=0}^{N-1} \left| V\left(e^{j(\omega - \frac{2\pi}{N}i)}\right) \right|^2 \le B < \infty, \; \omega \in (-\pi, \pi). \quad (3)$$

In accord with the principles disclosed herein, however, a subclass of windows is considered that satisfy the equation (3) condition with the caveat that A=B=N; which reduces equation (3) to:

$$\sum_{i=0}^{N-1} \left| V\left(e^{j(\omega - \frac{2\pi}{N}i)}\right) \right|^2 = N \text{ for all } \omega \in (-\pi, \pi). \quad (4)$$

The power complementarity condition of equation (4) permits good control over the effects of processing in the subband domain, and also assures stability.

When the analysis filters satisfy this condition, the norm of the input signal is related to the norm of the corresponding subband components $y_i$ as follows:

$$\|x\|^2 \le \frac{1}{N} \sum_i \|y_i\|^2. \quad (5)$$

It is noted that the considered signals belong to the space of square summable sequences, so the norm of x corresponds to $$\|x\| = \left( \sum_n |x[n]|^2 \right)^{1/2}.$$

If some processing modifies the subband components $y_i$ to $y_i + e_i$ (that is, the input signals to filter bank 300 in FIG. 1 are the signals ($y_i + e_i$), the total distortion in the signal x that is synthesized from the modified subband components is bounded by $$\|e_x\|^2 \le \frac{1}{N} \sum_{i=0}^{N-1} \|e_i\|^2. \quad (6)$$

On the other hand, if the window v satisfies the looser form of the perfect reconstruction condition given by equation (3), the distortions in the subband components and the distortion in the synthesized signal are related as $$\frac{1}{B} \sum_{i=0}^{N-1} \|e_i\|^2 \le \|e_x\|^2 \le \frac{1}{A} \sum_{i=0}^{N-1} \|e_i\|^2. \quad (7)$$

Equation (7) indicates that the distortion in the synthesized signal may grow considerably out of proportion when A is small. Thus, the distortion limit of equation (6) is one advantage that arises from adopting the power complementarity condition of equation (4). Another advantage that arises from, adopting the power complementarity condition of equation (4) is that an input signal can be perfectly reconstructed using a synthesis filter bank that consists of filters $$\tilde{V}\left(e^{j(\omega - \frac{2\pi}{N}i)}\right),$$

which are time-reversed versions of the analysis filters $$V\left(e^{j(\omega - \frac{2\pi}{N}i)}\right).$$

It is such filters that are depicted in filter bank 300 of FIG. 1 (with designation $\tilde{V}(z)$ corresponding to the time-reversed version of filter V(z)). That provides the convenience of not having to deal with the design of a synthesis window. Thus, the synthesis filter shown in FIG. 1 depicts filters 31, 32, and 33 that are the time-reversed versions of corresponding analysis filters 11, 12, and 13. It may be noted that the power complementarity condition of equation (4) also holds for the synthesis filter; i.e., $$\sum_{i=0}^{N-1} \left| \tilde{V}\left(e^{j(\omega - \frac{2\pi}{N}i)}\right) \right|^2 = N \text{ for all } \omega \in (-\pi, \pi).$$

Figure 2:
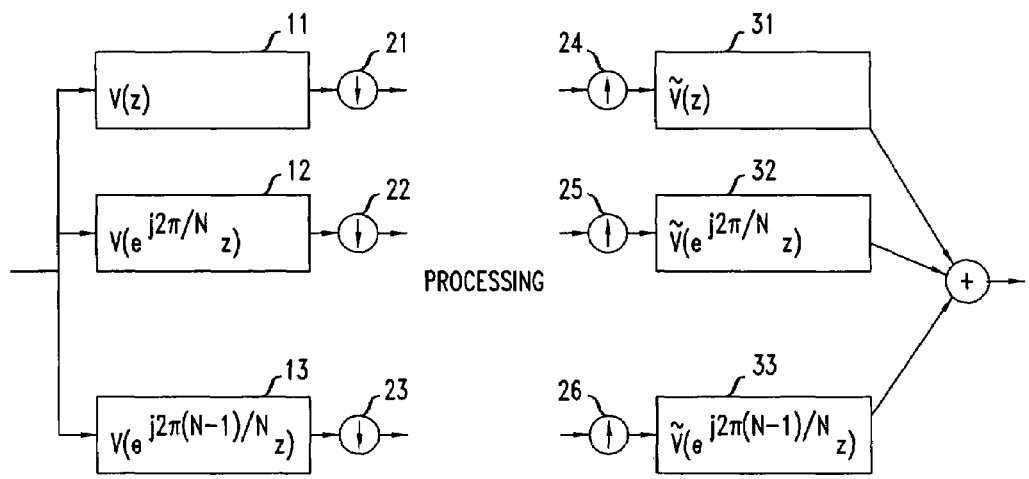
FIG. 2 shows the FIG. 1 arrangement, modified with a subsampling element interposed between the output of each analysis filter bank and the signal processing stage, and an upsampling element interposed between the signal processing stage and each synthesis filter bank.

FIG. 2 shows an analysis filter bank where, following each of the filters there is an associated subsampling circuit. That is, circuits 21, 22, and 23 follow filters 11, 12, and 13, respectively. Correspondingly, in the synthesis filter bank there are upsampling circuits 24, 25 and 26 that respectively precede filters 31, 32, and 33. In the case of the FIG. 2 arrangement where there is subsampling by K in the analysis channels, and the input signal is reconstructed from the subband components using time-reversed versions of the analysis filters preceded by K-factor upsampling, the reconstructed signal, in the Fourier domain, is given by $$X_r(e^{j\omega}) = \frac{1}{K} \sum_{i=0}^{N-1} \left| V\left(e^{j(\omega - \frac{2\pi}{N}i)}\right) \right|^2 + \frac{1}{K} \sum_{k=1}^{K-1} X\left(e^{j(\omega - \frac{2\pi}{K}k)}\right) A_k(e^{j\omega}) \quad (8)$$

where $A_k(e^{j\omega})$ are aliasing components $$A_k(e^{j\omega}) = \sum_{i=0}^{N-1} V\left(e^{j\left(\omega - \frac{2\pi}{N}i\right)}\right) V\left(e^{j\left(\omega - \frac{2\pi}{N}i;\frac{2\pi}{K}k\right)}\right). \quad (9)$$

Based on M. R. Portnoff, "Time-Frequency Representation of Digital Signals and Systems Based on Short-Time Fourier Analysis," *IEEE Transactions on Acoustics Speech and Signal Processing*, Vol. 28, No. 1, pp. 55–69, February 1980; and Z. Cvetkovic, "On Discrete Short-Timer Fourier Analysis," *IEEE Transaction on Signal Processing*, Vol. 48, No. 9, pp. 2628–2640, September 2000, it can be shown that the aliasing components reduce to zero, and a perfect reconstruction condition is attained, if the window satisfies the constraint:

$$\sum_j v[k+jK]v[k+iN+jK] = \frac{1}{K}\delta[i], k = 0, 1, \ldots K-1 \quad (10)$$

where $$\delta[i] = 1 \text{ when } i = 0 \quad (11)$$
$$= 0 \text{ otherwise}$$

As indicated above, the windows that are considered herein are those that satisfy the power complementarity condition in equation (4), and provide a nearly perfect reconstruction by having high enough attenuation for $\omega > 2\pi/K$. That is, there is no significant aliasing contribution due to subsampling; i.e., $$V(e^{j\omega})V\left(e^{j\omega - \frac{2\pi}{K}}\right) \approx 0 \text{ for all } \omega. \quad (12)$$

This makes aliasing sufficiently low in each subband independently.

In order to facilitate design of transition filters, it is convenient to deal with windows that also have sufficiently high attenuation for frequencies $\omega > 2\pi/N$. Sufficiently high attenuation for that purpose means that in the power complementarity formula of equation (4), for any $2\pi i/N < \omega < 2\pi(i+1)/N$, the only significant contribution to equation (4) comes from a filter having a center frequency at $2\pi i/N$ and the filter having a center frequency at $2\pi(i+1)/N$, the contribution of other filters is negligible. Stated in other words, a filter spills energy into the band of no other filters except, possibly, the immediately adjacent filters. Stated in still other words, the attenuation of a filter centered at $2\pi i/N$ at frequencies $(2\pi(i-1))/N > \omega > (2\pi(i+1))/N$ is greater than a selected value.

The above addresses uniform filters, with subsampling of K. One aspect of the arrangement disclosed herein, however, is the use of filters that are not necessarily of uniform bandwidth, where a signal can be analyzed with a time resolution that is commensurate with the bandwidth of the filters, and have these filters be such that a nearly perfect reconstruction of the signal is possible. Consider, therefore, a first filter section, such as section 100 in FIG. 2, with subsampling of $K_1$, and a window function $$v_1\left(V\left(e^{j\left(\omega - \frac{2\pi}{N_1}i\right)}\right)\right),$$

and a second filter section, such as section 100 in FIG. 2, with upsampling of $K_2$, and a window function $$v_2\left(V\left(e^{j\left(\omega - \frac{2\pi}{N_2}i\right)}\right)\right).$$

Consider further that window $v_1$ filters are employed below the "break-over" frequency $\omega_0$ and windows $v_2$ are employed above $\omega_0$. Consequently, there is a gap in the frequency response function, as shown by the filters on lines 10 and 30 in FIG. 3 (where, illustratively, $N_1=16$ and $N_2=12$) and the resulting gap region 40. This gap is filled with a transition analysis filter $V_{1,2}(e^{j(\omega+\omega_0)})$ having a window $v_{1,2}$.

Figure 3:
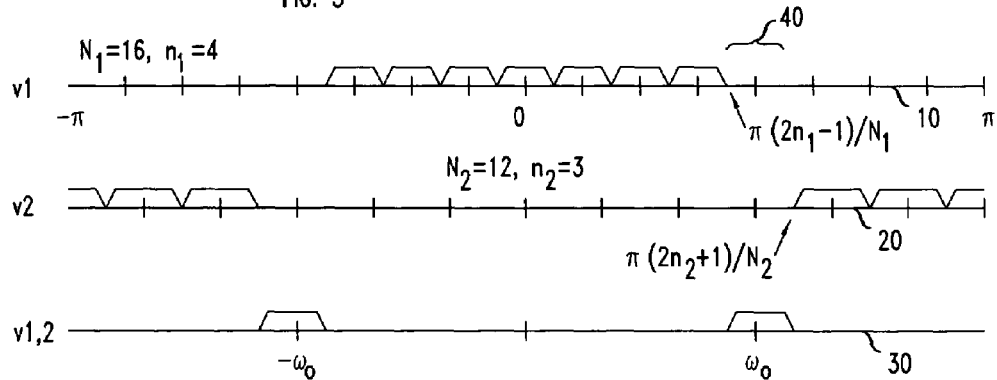
FIG. 3 shows the frequency response of the filter arrangement disclosed herein.
Figure 4:
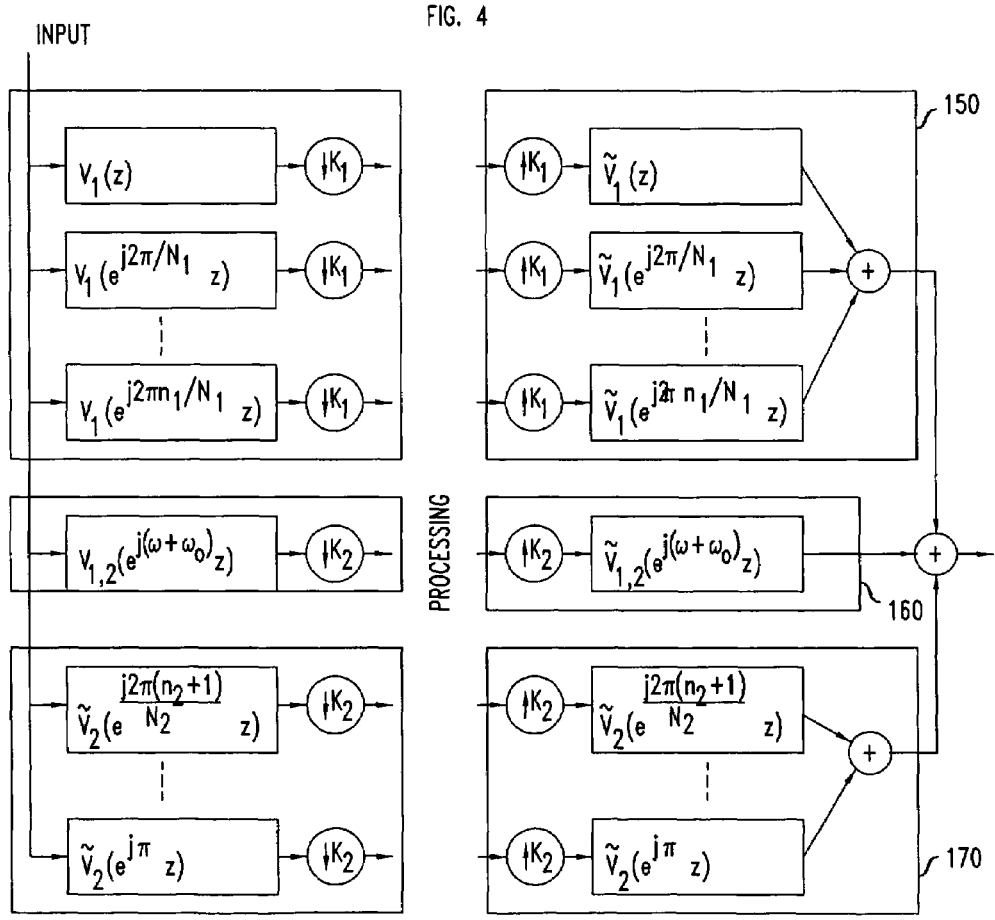
FIG. 4 presents a block diagram of the filter arrangement disclosed herein.

The shape of window $v_{1,2}$ is designed to provide for the aforementioned near perfect reconstruction of a signal (in the absence of processing between the analysis filters and the synthesis filters). When the transition analysis filter is chosen to be subsampled at rate $K_2$ (and the transition synthesis filter upsampled at rate $K_2$) the above constraint also means that the shape of window $v_{1,2}$ satisfies the expression $$\frac{1}{K_1}\sum_{i=0}^{n_1-1}\left|V_1\left(e^{j\left(\omega - \frac{2\pi}{N_1}i\right)}\right)\right|^2 + \quad (13)$$
$$\frac{1}{K_2}|V_{1,2}(e^{j(\omega-\omega_0)})|^2 + \frac{1}{K_2}\sum_{i=n_2}^{N_2-1}\left|V_2\left(e^{j\left(\omega - \frac{2\pi}{N_2}i\right)}\right)\right|^2 \approx R,$$

where R is a constant. This can be achieved by selecting the $v_{1,2}$ window to have the shape of the $v_2$ at positive frequencies, and the shape of the $v_1$ at negative frequencies; but the latter being scaled by $\sqrt{N_1/N_2}$. That is the arrangement shown on line 30 of FIG. 3. The physical filter arrangement is shown in FIG. 4, with filter bank 150 providing the response of line 10 in FIG. 3, filter bank 160 providing the response of line 30 in FIG. 3, and filter 170 providing the response of line 20 in FIG. 3.

In a relatively simple embodiment, the subsampling factors $(K_1, K_2)$ and window bandwidths $(2\pi/N_1, 2\pi/N_2)$ are selected so that $N_1/K_1 = N_2/K_2 = R$, and the "break-over" frequency, $\omega_0$, is chosen to satisfy the condition $$2\pi n_1/N_1 = 2\pi n_2/N_2 = \omega_0; \quad (14)$$

where $n_1$ and $n_2$ are integers. In FIG. 3, for example, $N_1=16$, $N_2=12$, $n_1=4$ and $n_2=3$. Filter bank 150, in accordance with the above, includes filters $V_1(ze^{-j2\pi i/N_1})$, where $i=0, 1, 2, \ldots, n_1-1, \ldots, N_1-n_1+1, N_1-n_1+2, \ldots, N_1-1$, and filter bank 170 includes filters $V_2(ze^{-j2\pi i/N_2})$, where $i=n_2+1, n_2+1, \ldots, N_2-n_2-1$.

Based on the above, one can conclude that in order to have nearly perfect reconstruction in a nonuniform filter bank that comprises uniform filter bank sections, the window of each of the uniform filter banks should have sufficiently high attenuation for ω greater than 2π divided by the respective value of K of the filter, and also sufficiently high attenuation for ω greater than 2π divided by the respective value of N of the filter. The attenuation for ω>2π/K controls aliasing, while the high attenuation for ω>2π/N facilitates design of transition filters for attaining nearly perfect reconstruction with the nonuniform filter bank. Roughly speaking, the attenuation at ω=2π/N, and twice that attenuation at ω=2π/K, expressed in decibels, have a comparable effect on the error in the approximation of equation (13).

To design a window that has a high attenuation in the band π/N to π, one can simply impose the requirement that the integral of the energy in that band should be minimized. As indicated above, some spilling of energy close to π/N is permissible, but it is considered important that the attenuation that is farther removed from π/N should be large. To achieve this result, it is suggested that the function to be minimized might be one that accentuates higher frequencies. For example, one might choose to minimize the weighted integral $$E_N = \int_{\pi/N}^{\pi} |V(e^{j\omega})|^2 \omega^3 d\omega. \quad (15)$$

This energy function is given by the quadratic form $$E_N = v^T T v, \quad (16)$$

where v is the window (time) function in the form of a column vector and the matrix T comprises the elements:

$$[T]_{i,j} = \int_{\pi/N}^{\pi} \omega^3 \cos((i-j)\omega) d\omega. \quad (17)$$

The window design requires minimization of the quadratic form in equation (16) under the power complementarity condition which, expressed in the time domain, takes the form of the following set of quadratic constraints:

$$\sum_n v[n]v[n+iN] = \delta[i]. \quad (18)$$

This is a perfectly valid design approach, but it can be numerically very extensive and hard to implement for long windows. A simpler and faster approach to window design is found in an article by the inventor herein, Z. Cvetkovic, "On Discrete Short-Time Fourier Analysis," IEEE Transactions on Signals Processing, Vol. 48, No. 9, September 2000, pp. 2628–2640, which is hereby incorporated by reference, and is briefly described below. This simpler design approach represents a window using linear combination of discrete prolate spheriodal sequences that are eigen vectors of matrices $S_L(\alpha)$, with matrix elements:

$$[S_L(\alpha)]_{i,j} = \sin((i-j)\alpha)/(i-j)\pi, \ 1 \leq i,j \leq L, \ \alpha = \pi/N. \quad (19)$$

Given a column vector v, the quadratic form $v^T S_L(\alpha) v$ gives energy of v in the frequency band $(0,\pi/N)$. The eigen vectors $\rho_0, \rho_1, \ldots \rho_{L-1}$ of $S_L(\alpha)$ are orthogonal, and corresponding eigenvalues $\lambda_0, \lambda_1, \ldots, \lambda_{L-1}$ are distinct and positive. Sorting the eigenvectors so that $\lambda_i > \lambda_{i+1}$, a window to be designed is constructed from a linear combination for the first L/N+k+1 eigenvectors, $$v = \sum_{i=0}^{L/N+k} \alpha_i \rho_i \quad (20)$$

where we take k to be a number between 5 and 10. The constraints of equation (18) translate into the following set of constraints in the expansion coefficients, $$\sum_{l,m=0}^{L/N+k} C_{lm}^{(k)} a_l a_m = \delta[k], k = 1, 2, \ldots, L/N - 1 \quad (21)$$

where $$c_{lm}^{(k)} = \sum_n \rho_l[n] \rho_m[n+kN].$$

The design then amounts to finding the minimum of the quadratic form $a^T T_\alpha a$ under the constraints of equation (21), where $$a = [\alpha_0 \ldots \alpha_{(L/N+k)}]^T, \quad (23)$$

$T_\alpha = r^T T r$, and r is the matrix of the first L/N+k+1 eigenvectors $\rho_i$, $$r = [\rho_0 \rho_0 \ldots \rho_{L/N+k}]. \quad (24)$$

A transition window $v_{1,2}$ for joining a uniform section of an $N_1$-channel filter bank based on a window $v_1$ at low frequencies with a uniform section of an $N_2$-channel filter bank based on a window $v_2$ at high frequencies is designed by approximating, as closely as possible, the frequency response of $v_1$ at negative frequencies, and the frequency response of $v_2$ at positive frequencies. This amounts to a minimizing energy function $E_{tr}$ given by $$E_{tr} = \int_{-\pi}^{0} |V_1(e^{j\omega}) - V_{1,2}(e^{j\omega})|^2 d\omega + \int_0^{\pi} |\beta V_2(e^{j\omega}) - V_{1,2}(e^{j\omega})|^2 d\omega \quad (25)$$

where $\beta = \sqrt{N_1/N_2}$, and carrying out the design process as discussed above.

It is noted that the choice of $\omega_0$ is not completely unconstrained because, if one wishes the relationship $$\omega_0 = \frac{2\pi n_1}{N_1}$$

to hold, where both $n_1$ and $N_1$ are integers; and this is particularly true when the value of $N_1$ is constrained by other design preferences. This, however, is not an absolute limitation of the design approach disclosed herein because as long as a gap is left between filter banks (like gap 40) and a transition filter is designed that meets the requirements of equation (13), near perfect reconstruction performance is attainable.

The above disclosed an arrangement where the frequency band of interest is divided into two bands, with each of the two bands being handled by one filter bank, and with a single transition filter between the two filter banks. It should be realized that this design approach could be easily extended to a non-uniform filter bank that includes any number of uniform filter banks, with each uniform filter bank segments having a lower cutoff frequency, $\omega_{lower}^i$, and an upper cutoff frequency, $\omega_{upper}^i$ and the number of filters in the bank being dictated by the two cutoff frequencies and the desired bandwidth, $2\pi/N_i$.

The above disclosed an approach for creating a filter bank that performs a non-uniform decomposition of a signal having a given bandwidth, by means of an example where two different filter bank sections are joined using a transition filter. A more general non-uniform filter bank can be created by joining non-overlapping sections of any number of uniform filter banks, using a plurality of transition filters. Many variations can be incorporated by persons skilled in the art based on the disclosed approach, without departing from the spirit and scope of this invention. For example, assume that three bands are desired, with "break-over" frequencies $\omega_0$ and $\omega_1$. A set of constants can be selected so that $2\pi n_1/N_1 = 2\pi n_{2,1}/N_2 = \omega_0$ and $2\pi n_{2,2}/N_2 = 2\pi n_3/N_3 = \omega$; filters $V_1$, $V_2$, $V_3$ can be selected, together with filters $V_{1,2}$ and $V_{2,3}$ can be designed, as described above.

The invention claimed is:

1. An arrangement comprising:
A collection of filters responsive to a common signal, where filter i has the transfer function $$V\left(e^{j(\omega - \frac{2\pi}{N}i)}\right),$$

V is a given window filter function, i=0, 1, 2, ... N−1, and $$\sum_{i=0}^{N-1} \left|V\left(e^{j(\omega + \frac{2\pi}{N}i)}\right)\right|^2 = N$$

for all $\omega \in (-\pi, \pi)$.

2. The arrangement of claim 1, further comprising:
a combiner for adding output signals of said filters to form an output signal of said arrangements.

3. The arrangement of claim 2 where $$\sum_{i=0}^{N-1} \left|\overline{V}(e^{j(\omega + \frac{2\pi}{N}i)})\right|^2 = N$$

for all $\omega \in (-\pi, \pi)$ wherein $$\overline{V}(e^{j(\omega - \frac{2\pi}{N}i)})$$

is the time-reversed version of the filter $$V(e^{j(\omega - \frac{2\pi}{N}i)}).$$

4. An arrangement comprising:
an $n_1$ plurality of analysis filters i, where i=0, 1, ... $n_1$−1, each developing an output signal and each coupled to a circuit that subsamples the associated output signal by a factor of K1, where each filter i has a transfer function $$V_1\left(e^{j(\omega - \frac{2\pi}{N_1}i)}\right),$$

symmetric about $\omega=0$, where $n_1$ is a first constant, $N_1$ is a second constant, and $V_1$ is a first preselected window filter function;
an $(N_2/2) - n_2$ plurality of analysis filters k where $k = n_2 + 1, n_2 + 2, \ldots N_2/2$, each developing an output signal and each coupled to a circuit that subsamples the associated output signal by a factor of K2, where each filter k has a transfer function $$V_2\left(e^{j(\omega - \frac{2\pi}{N_2}i)}\right),$$

symmetric about $\omega=0$, where $n_2$ is a third constant, $N_2$ is a fourth constant, and $V_2$ is a second preselected window filter function; and
a transition analysis filter that develops an output signal, coupled to a circuit that subsamples said output signal of said transition filter by a factor of K1 or K2, having a bandpass transfer function that fills-in a gap frequencies that are passed by said $n_1$ plurality of filters and frequencies that are passed by said $(N_2/2) - n_2$ plurality of filters.

5. The arrangement of claim 4 where $V_1$ has an attenuation at frequencies greater than $2\pi/N_1$ that is large enough to produce an insignificant output at those frequencies, and $V_2$ has an attenuation at frequencies greater than $2\pi/N_2$ that is large enough to produce an insignificant output at those frequencies.

6. The arrangement of claim 4 where $\tilde{V}_1$ is such that an energy integral $\int_{\pi/N_1}^{\pi} |\tilde{V}_1(e^{j\omega})|^2 \omega^3 d\omega$ that is associated with $\tilde{V}_1$ is lower than a preselected level.

7. The arrangement of claim 4 where $N_2 < N_1$.

8. The arrangement of claim 4 where said transition analysis filter has a passband between $$\frac{\pi(2n_1 - 1)}{N_1} \text{ and } \frac{\pi(2n_2 + 1)}{N_2}.$$

9. The arrangement of claim 4 where said transition analysis filter has a transfer function $V_{1,2}(e^{j(\omega + \omega_0)})$, where $\omega_0 = 2\pi n_1/N_1 = 2\pi n_2/N_2$ and $V_{1,2}$ is a third window filter function.

10. The arrangement of claim 9 where $V_{1,2}$ is a window filter with a transfer function that, at positive frequencies, corresponds to said transfer function $V_2$ at positive frequencies, and at negative frequencies corresponds to said transfer function $V_1$ at negative frequencies.

11. The arrangement of claim 9 where window shape of $V_{1,2}$ satisfies condition $$\frac{1}{K_1} \sum_{i=0}^{n_1 - 1} \left|V_1\left(e^{j(\omega + \frac{2\pi}{N_1}i)}\right)\right|^2 +$$

-continued $$\frac{1}{K_2}|V_{1,2}(e^{j(\omega+\omega_0)})|^2 + \frac{1}{K_2}\sum_{i=n_2}^{N_2-1}\left|V_2\left(e^{j\left(\omega+\frac{2\pi}{N_2}i\right)}\right)\right|^2 \approx R$$

when said subsampling at the circuit coupled to said transition analysis filter subsamples by a factor of K2, and the condition $$\frac{1}{K_1}\sum_{i=0}^{n_1-1}\left|V_1\left(e^{j\left(\omega+\frac{2\pi}{N_1}i\right)}\right)\right|^2 +$$

$$\frac{1}{K_1}|V_{1,2}(e^{j(\omega+\omega_0)})|^2 + \frac{1}{K_2}\sum_{i=n_2}^{N_2-1}\left|V_2\left(e^{j\left(\omega+\frac{2\pi}{N_2}i\right)}\right)\right|^2 \approx R$$

when said subsampling at the circuit coupled to said transition analysis filter subsamples by a factor of K1, where $R=N_1/K_1=N_2/K_2$.

12. The arrangement of claim 9 where $V_{1,2}$ is a function such that an energy integral $E_{tr}=\int_{-\pi}^{0}|V_1(e^{j\omega})-V_{1,2}(e^{j\omega})|^2d\omega + \int_{0}^{\pi}|\beta V_2(e^{j\omega})-V_{1,2}(e^{j\omega})|^2d\omega$ that is associated with $V_{1,2}$ is minimized, where $\beta=\sqrt{N_1/N_2}$.

13. The arrangement of claim 4 where said transition analysis filter has a transfer function $V_{1,2}(e^{j(\omega+\omega_0)})$, where $2\pi(n_1-1)/N_1<\omega_0<2\pi(n_2+1)/N_2$ and $V_{1,2}$ is a third window filter function.

14. The arrangement of claim 13 where $V_{1,2}$ is a window filter with a transfer function that, at positive frequencies, corresponds to said transfer function $V_2$ at positive frequencies, and at negative frequencies corresponds to said transfer function $V_1$ at negative frequencies.

15. The arrangement of claim 13 where window shape of $V_{1,2}$ satisfies condition $$\frac{1}{K_1}\sum_{i=0}^{n_1-1}\left|V_1\left(e^{j\left(\omega+\frac{2\pi}{N_1}i\right)}\right)\right|^2 +$$

$$\frac{1}{K_1}|V_{1,2}(e^{j(\omega+\omega_0)})|^2 + \frac{1}{K_2}\sum_{i=n_2}^{N_2-1}\left|V_2\left(e^{j\left(\omega+\frac{2\pi}{N_2}i\right)}\right)\right|^2 \approx R$$

when said subsampling at the circuit coupled to said transition analysis filter subsamples by a factor of K2, and the condition $$\frac{1}{K_1}\sum_{i=0}^{n_1-1}\left|V_1\left(e^{j\left(\omega+\frac{2\pi}{N_1}i\right)}\right)\right|^2 +$$

$$\frac{1}{K_1}|V_{1,2}(e^{j(\omega+\omega_0)})|^2 + \frac{1}{K_2}\sum_{i=n_2}^{N_2-1}\left|V_2\left(e^{j\left(\omega+\frac{2\pi}{N_2}i\right)}\right)\right|^2 \approx R$$

when said subsampling at the circuit coupled to said transition analysis filter subsamples by a factor of K1, where $R=N_1/K_1=N_2/K_2$.

16. An arrangement comprising:
an $n_1$ plurality of upsampling circuits, each responsive to an associated input signal and upsampling its input signal by a factor of K1;
an $n_1$ plurality of synthesis filters i where i=0, 1, ... $n_1-1$, each responsive to an associated one of said $n_1$ plurality of upsampling circuits, where each filter i has a transfer function $$\tilde{V}_1\left(e^{j\left(\omega+\frac{2\pi}{N_1}i\right)}\right),$$

symmetric about $\omega=0$, $n_1$ is a first constant, $N_1$ is a second constant, and $\tilde{V}_1$ is a first preselected window filter function;
an $(N_2/2)-n_2$ plurality of upsampling circuits, each responsive to an associated input signal port and upsampling its input signal by a factor of K2;
an $(N_2/2)-n_2$ plurality of synthesis filters k where $k=n_2+1$, $n_2+2$, ... $N_2/2$, each responsive to an associated one of said $(N_2/2)-n_2$ plurality of upsampling circuits, where each filter k has a transfer function $$\tilde{V}_2\left(e^{j\left(\omega+\frac{2\pi}{N_1}k\right)}\right),$$

symmetric about $\omega=0$, $n_2$ is a third constant, $N_2$ is a fourth constant, and $V_2$ is a second preselected window filter function;
a transition upsampling circuit, responsive to an associated input signal port that oversamples its input signal by a factor of K1 or K2;
a transition synthesis filter responsive to said transition upsampling circuit, having a bandpass transfer function that fills-in a gap frequencies passed by said $n_1$ plurality of filters and frequencies passed by said $(N_2/2)-n_2$ plurality of filters; and
an addition circuit that combines output signals of said $n_1$ plurality of filters, said transition filter, and said $(N_2/2)-n_2$ plurality of filters, to develop an output signal.

17. The arrangement of claim 16 where $\tilde{V}_1$ has an attenuation at frequencies greater than $2\pi/N_2$ that is large enough to produce an insignificant output at those frequencies, and $\tilde{V}_2$ has an attenuation at frequencies greater than $2\pi/N_2$ that is large enough to produce an insignificant output at those frequencies.

18. The arrangement of claim 16 where $\tilde{V}_1$ is such that an energy integral $\int_{\pi/N_1}^{\pi}|\tilde{V}_1(e^{j\omega})|^2\omega^3d\omega$ that is associated with $\tilde{V}_1$ is lower than a preselected level.

19. The arrangement of claim 16 where $N_2<N_1$.

20. The arrangement of claim 16 where said transition synthesis filter has a pass band between $$\frac{\pi(2n_1-1)}{N_1} \text{ and } \frac{\pi(2n_2+1)}{N_2}.$$

21. The arrangement of claim 16 where said transition synthesis filter has a transfer function $\tilde{V}_{1,2}(e^{j(\omega+\omega_0)})$, where $\omega_0=2\pi n_1/N_1=2\pi n_2/N_2$ and $\tilde{V}_{1,2}$ is a third window filter function.

22. The arrangement of claim 16 where said transition synthesis filter has a transfer function $\tilde{V}_{1,2}(e^{j(\omega+\omega_0)})$, where $2\pi(n_1-1)/N_1<\omega_0<2\pi(n_2+1)/N_2$ and $\tilde{V}_{1,2}$ is a third window filter function.

23. The arrangement of claim 21 where $\tilde{V}_{1,2}$ is a function such that an energy integral $E_{tr}=\int_{-\pi}^{0}|\tilde{V}_1(e^{j\omega})-\tilde{V}_{1,2}(e^{j\omega})|^2 d\omega+\int_{0}^{\pi}|\beta\tilde{V}_2(e^{j\omega})-\tilde{V}_{1,2}(e^{j\omega})|^2 d\omega$ that is associated with $\tilde{V}_{1,2}$ is minimized, where $\beta=\sqrt{N_1/N_2}$.

24. The arrangement of claim 21 where $\tilde{V}_{1,2}$ is a window filter with a transfer function that, at positive frequencies, corresponds to said transfer function $\tilde{V}_2$ at positive frequencies, and at negative frequencies corresponds to said transfer function $\tilde{V}_1$ at negative frequencies.

25. The arrangement of claim 21 where window shape of $\tilde{V}_{1,2}$ satisfies condition $$\frac{1}{K_1}\sum_{i=0}^{n_1-1}\left|\overline{V}_1\left(e^{j\left(\omega+\frac{2\pi}{N_1}i\right)}\right)\right|^2 +$$

$$\frac{1}{K_2}|\overline{V}_{1,2}(e^{j(\omega+\omega_0)})|^2 + \frac{1}{K_2}\sum_{i=n_2}^{N_2-1}\left|\overline{V}_2\left(e^{j\left(\omega+\frac{2\pi}{N_2}i\right)}\right)\right|^2 \approx R$$

when said subsampling at the circuit coupled to said transition synthesis filter subsamples by a factor of K2, and the condition $$\frac{1}{K_1}\sum_{i=0}^{n_1-1}\left|V_1\left(e^{j\left(\omega+\frac{2\pi}{N_1}i\right)}\right)\right|^2 +$$

$$\frac{1}{K_1}|V_{1,2}(e^{j(\omega+\omega_0)})|^2 + \frac{1}{K_2}\sum_{i=n_2}^{N_2-1}\left|V_2\left(e^{j\left(\omega+\frac{2\pi}{N_2}i\right)}\right)\right|^2 \approx R$$

when said subsampling at the circuit coupled to said transition analysis filter subsamples by a factor of K1, where $R=N_1/K_1=N_2/K_2$.

26. The arrangement of claim 4 comprising:
- a signal processing stage responsive to output signals of said $n_1$ plurality of analysis filters, said $(N_2/2)-n_2$ plurality of analysis filters, and said transition analysis filter, and developing therefrom a plurality of processed signals; and
- an arrangement according to claim 16 responsive to said plurality of processed signals.

27. The arrangement of claim 26 where said plurality of processed signals comprises no processed signals that are respectively derived from output signals of said $n_1$ plurality of analysis filters, a processed signal that is derived from said transition analysis filter, and $(N_2/2)-n_2$ processed signals that are respectively derived from said $(N_2/2)-n_2$ plurality of analysis filters.

28. The arrangement of claim 27 where
- a processed signal derived from filter i of said $n_1$ plurality of analysis filters is coupled to the upsampling circuit that is coupled to filter i of said $n_1$ plurality of synthesis filters;
- a processed signal derived from filter k of said $(N_2/2)-n_2$ plurality of analysis filters is coupled to the upsampling circuit that is coupled to filter k of said $(N_2/2)-n_2$ plurality of synthesis filters; and
- said processed signal derived from said transition analysis filter is coupled to the upsampling circuit that is coupled to said transition synthesis filter.

29. The arrangement of claim 28 where $V_q$ is a window filter, q takes on the value 1, 2, or 1,2, and $\tilde{V}_q$ a time-reversed version of said filter $V_q$.

* * * * *